(12) United States Patent
Huang et al.

(10) Patent No.: US 10,453,741 B2
(45) Date of Patent: Oct. 22, 2019

(54) METHOD FOR FORMING SEMICONDUCTOR DEVICE CONTACT

(71) Applicant: Taiwan Semiconductor Manufacturing Co., Ltd., Hsin-Chu (TW)

(72) Inventors: Cheng-Chien Huang, Hsinchu (TW); Tsung-Yu Chiang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 82 days.

(21) Appl. No.: 15/486,185

(22) Filed: Apr. 12, 2017

(65) Prior Publication Data

US 2018/0166329 A1 Jun. 14, 2018

Related U.S. Application Data

(60) Provisional application No. 62/433,648, filed on Dec. 13, 2016.

(51) Int. Cl.
| | |
|---|---|
| *H01L 21/768* | (2006.01) |
| *H01L 29/45* | (2006.01) |
| *H01L 29/66* | (2006.01) |
| *H01L 29/78* | (2006.01) |
| *H01L 21/02* | (2006.01) |
| *H01L 21/285* | (2006.01) |

(52) U.S. Cl.
CPC .. *H01L 21/76814* (2013.01); *H01L 21/02063* (2013.01); *H01L 21/76825* (2013.01); *H01L 29/456* (2013.01); *H01L 29/665* (2013.01); *H01L 29/66636* (2013.01); *H01L 29/78* (2013.01); *H01L 21/28518* (2013.01); *H01L 21/76897* (2013.01)

(58) Field of Classification Search
None
See application file for complete search history.

(56) References Cited

U.S. PATENT DOCUMENTS

| | | | | |
|---|---|---|---|---|
| 6,455,428 B1* | 9/2002 | Tseng | ................ | H01L 21/31058 257/E21.242 |
| 6,642,620 B1* | 11/2003 | Sharan | .............. | H01L 21/28518 257/754 |
| 7,781,282 B2* | 8/2010 | Yoo | ................... | H01L 21/76895 257/197 |
| 7,968,454 B2* | 6/2011 | Park | .................... | H01L 21/0337 257/E21.577 |
| 8,772,109 B2 | 7/2014 | Colinge | | |
| 8,785,285 B2 | 7/2014 | Tsai et al. | | |
| 8,816,444 B2 | 8/2014 | Wann et al. | | |

(Continued)

*Primary Examiner* — Chandra Chaudhari
(74) *Attorney, Agent, or Firm* — Duane Morris LLP

(57) ABSTRACT

A method of making a semiconductor device includes forming a gate stack that include a gate electrode and a spacer layer extending along a sidewall of the gate electrode; forming a source/drain (S/D) feature that is adjacent to the gate stack; forming a dielectric layer over the gate stack and the S/D feature; forming a contact hole in the dielectric layer to expose the S/D feature, wherein the contact hole includes a first sidewall that is formed by the spacer layer and part of the dielectric layer; doping an upper portion of the first sidewall; and performing an etching process thereby cleaning oxides in the contact hole.

18 Claims, 10 Drawing Sheets

(56) References Cited

U.S. PATENT DOCUMENTS

| | | |
|---|---|---|
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |

* cited by examiner

METHOD FOR FORMING SEMICONDUCTOR DEVICE CONTACT

CROSS-REFERENCE TO RELATED APPLICATION

The present application claims priority to U.S. Provisional Patent Application No. 62/433,648, filed on Dec. 13, 2016, which is incorporated by reference herein in its entirety.

BACKGROUND

The semiconductor industry has progressed into nanometer technology process nodes in pursuit of higher device density, higher performance, and lower cost. In the course of integrated circuit (IC) evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Despite advances in materials and fabrication, scaling either planar (e.g., the planar FET) or three-dimensional (e.g., the FinFET) devices has proven challenging. For example, such scaling-down reduces the size of the area that can be used to connect a transistor to other components. Accordingly, an interconnect structure with such a limited area may disadvantageously impact a respective junction resistance, which in turn may degrade the transistor's switching speed.

A variety of technologies have been proposed to overcome this. Among them, a silicide layer formed between a transistor's source/drain feature and a respective interconnect structure (e.g., a source/drain contact) is typically used to decrease the junction resistance. Generally, a pre-clean process (e.g., one or more etching processes) is performed before forming the above-mentioned silicide layer. Although the pre-clean process advantageously removes undesirable residues/particles (e.g., oxides), the pre-clean process may also cause some damage to peripheral components and structures given the pre-clean process's isotropic characteristic. The damage to the peripheral components and structures (e.g., a spacer layer, an inter-layer dielectric layer, etc.) may in turn cause a bridge to be formed between a gate electrode and a source/drain contact, which may induce a variety of issues such as, for example, a short circuit. Thus, the existing technologies to form a source/drain contact of a transistor have not been entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

Figure 1:
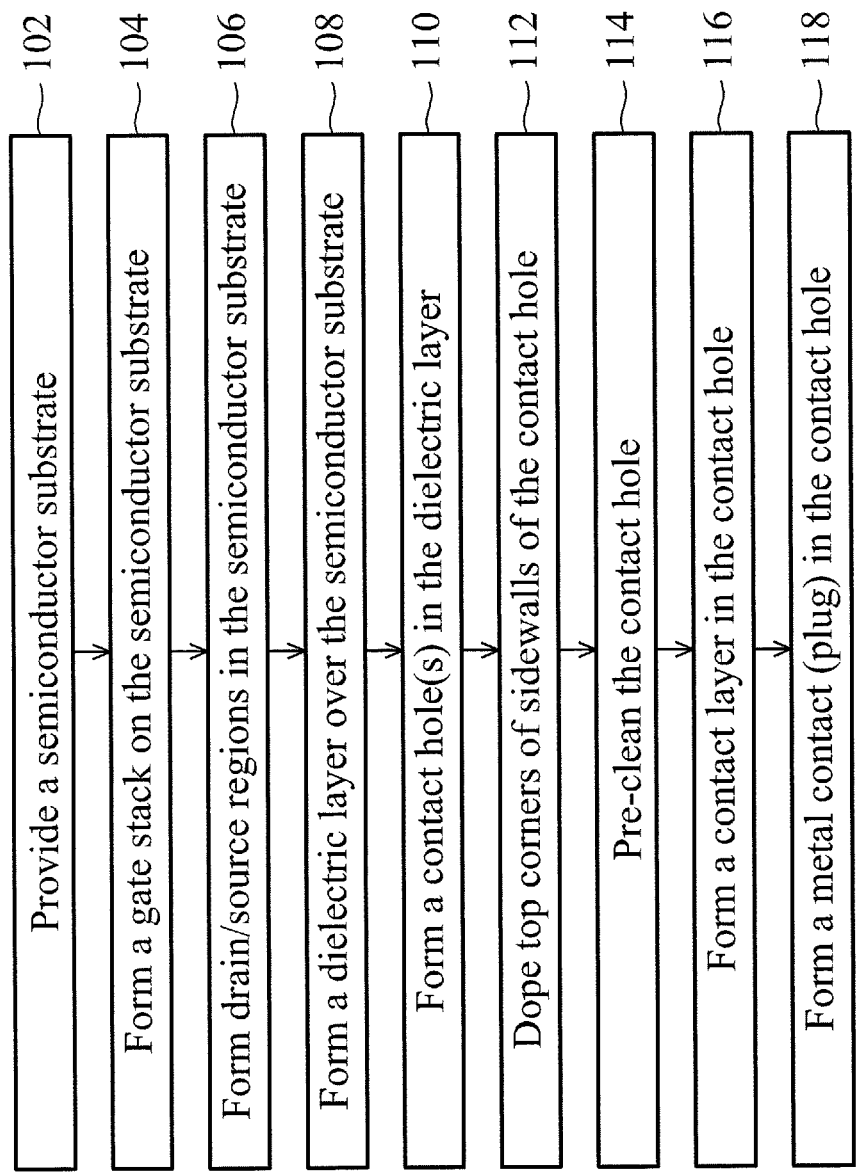
FIG. 1 illustrates a flow chart of a method to form a semiconductor device, in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of methods to form a semiconductor device that may be immune from the above-mentioned issue. Some embodiments of the present disclosure provide methods to form a source/drain (S/D) contact of a complementary metal-oxide-semiconductor (CMOS) transistor by doping a sidewall of a contact hole where the source/drain contact is to be formed. More specifically, such a doping process is performed anisotropically on the sidewall's respective top corner(s). As such, the doped sidewall may thus present a decreased etch rate, i.e., an increased etch resistivity. In accordance with some embodiments, the increased etch resistivity may help the sidewall to withstand one or more etching processes (e.g., the above-mentioned pre-clean processes) that are typically used before forming a silicide layer in the contact hole. Moreover, the methods of the present disclosure require no additional structures or components to be made, which allows the methods to be seamlessly integrated into existing CMOS fabrication technologies.

FIG. 1 illustrates a flowchart of a method 100 to form a semiconductor device 200 according to one or more embodiments of the present invention. It is noted that the method 100 is merely an example, and is not intended to limit the present disclosure. Additional operations can be provided before, during, and after the method 100, and some operations described can be replaced, eliminated, or moved around in accordance with additional embodiments. The method 100 is described below in conjunction with FIGS. 2A-2I that illustrate, in a cross-sectional view, a portion of the semiconductor device 200 at various fabrication stages.

In some embodiments, the semiconductor device 200 includes one or more field effect transistors (FETs). Further, although the semiconductor device 200 is constructed as a planar FET structure, in some embodiments, the disclosed method 100 may be used to make a three-dimensional FET structure, for example, a fin FET (FinFET) structure.

The method 100 starts with operation 102 in which a semiconductor substrate 202 (FIG. 2A) is provided, in accordance with various embodiments. As shown in the illustrated embodiment of FIG. 2A, the semiconductor device 200 includes a semiconductor substrate 202. In some embodiments, the semiconductor substrate 110202 includes silicon. Alternatively, the semiconductor substrate 202 includes germanium (Ge), silicon germanium (SiGe), or other proper semiconductor materials such as, for example, III/V compound materials. In some other embodiments, the semiconductor substrate 202 may include a buried dielectric material layer for isolation formed by a proper technology, such as a technology typically referred to as separation by implanted oxygen (SIMOX). Still in some other embodiments, the semiconductor substrate 202 may be a semiconductor on insulator, such as a silicon on insulator (SOI).

As various examples for illustration, the semiconductor device 200 includes other components or features. In some embodiments, isolation features, such as various shallow trench isolation (STI) features 204, are formed in the semiconductor substrate 202 and defined active region (or semiconductor region) 206. The active region 206 is isolated and surrounded by the STI features 204. In one example, a top surface of the semiconductor substrate 202 and top surfaces of the STI features 204 may be coplanar, resulting in a common top surface. In another example, the top surface of the semiconductor substrate 202 and the top surfaces of the STI features 204 are not coplanar, resulting in a three-dimensional structure, such as a fin FET (FinFET) structure, as mentioned above.

In some embodiments, the formation of the STI features 204 includes: forming a hard mask with openings that define the regions for STI features; etching the semiconductor substrate 202 through the openings of the hard mask to form trenches in the semiconductor substrate 202; depositing one or more dielectric material to fill in the trenches; and performing a chemical mechanical polishing (CMP) process. As one embodiment for illustration, the depth of the STI features 204 ranges between about 50 nanometers (nm) and about 500 nm. More specifically, the formation of the hard mask includes depositing a hard mask layer; a lithography process to form a patterned resist layer on the hard mask layer; and etching the hard mask layer using the patterned resist layer as an etch mask. The deposition of the dielectric material further includes thermal oxidation of the trenches and then filling in the trenches by the dielectric material, such as silicon oxide, by a CVD (chemical vapor deposition) process. In one example, the CVD process to fill in the trenches includes high density plasma CVD (HDP-CVD). In some embodiments, the formation of the STI features 204 further includes removing the hard mask after CMP. In another embodiment, the hard mask includes a silicon oxide layer by thermal oxidation and a silicon nitride on the silicon oxide layer by the CVD process.

Figure 2A:
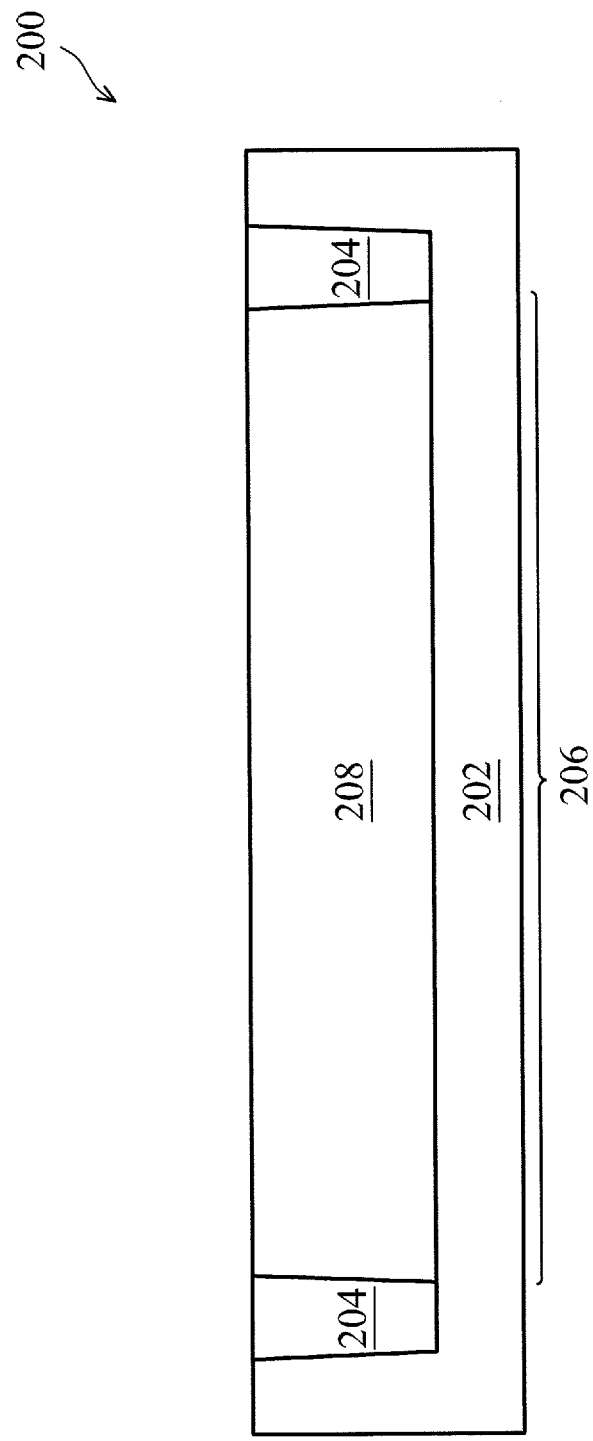
FIGS. 2A, 2B, 2C, 2D, 2E, 2F, 2G, 2H, and 2I illustrate sectional views of an exemplary semiconductor device during various fabrication stages, made by the method of FIG. 1, in accordance with some embodiments.

In FIG. 2A, the active region 206 is designed to form an FET, such as a p-type FET (pFET) or an n-type FET (nFET). In some embodiments, a doped well 208 may be formed in the active region 206. In some examples, the doped well 208 includes an n-type dopant, such as phosphorous (P) and/or arsenic (As), distributed in the active region 206 where a pFET is to be formed. The n-type dopant may be introduced to the n-well 208 through an opening of the mask layer by a suitable doping process, such as one or more ion implantation processes. In some other examples, the doped well 208 includes a p-type dopant, such as boron (B), distributed in the active region 206 where an nFET is to be formed. The p-type dopant may be introduced to the p-well 208 through an opening of the mask layer by a suitable doping process, such as one or more ion implantation. The STI features 204 further function to define the dopants to the desired active regions. In the present example for illustration, the doped well 208 is formed in the active region 206. In one example, the doped well 208 may have a corresponding doping concentration ranging between about $10^{16}$ and $10^{18}$ cm$^{-3}$ of either the n-type or p-type dopant implanted into substrate 202. In another example, the doped well 208 may have a depth ranging between about 0.5 micrometers (μm) and 2 μm.

Figure 2B:
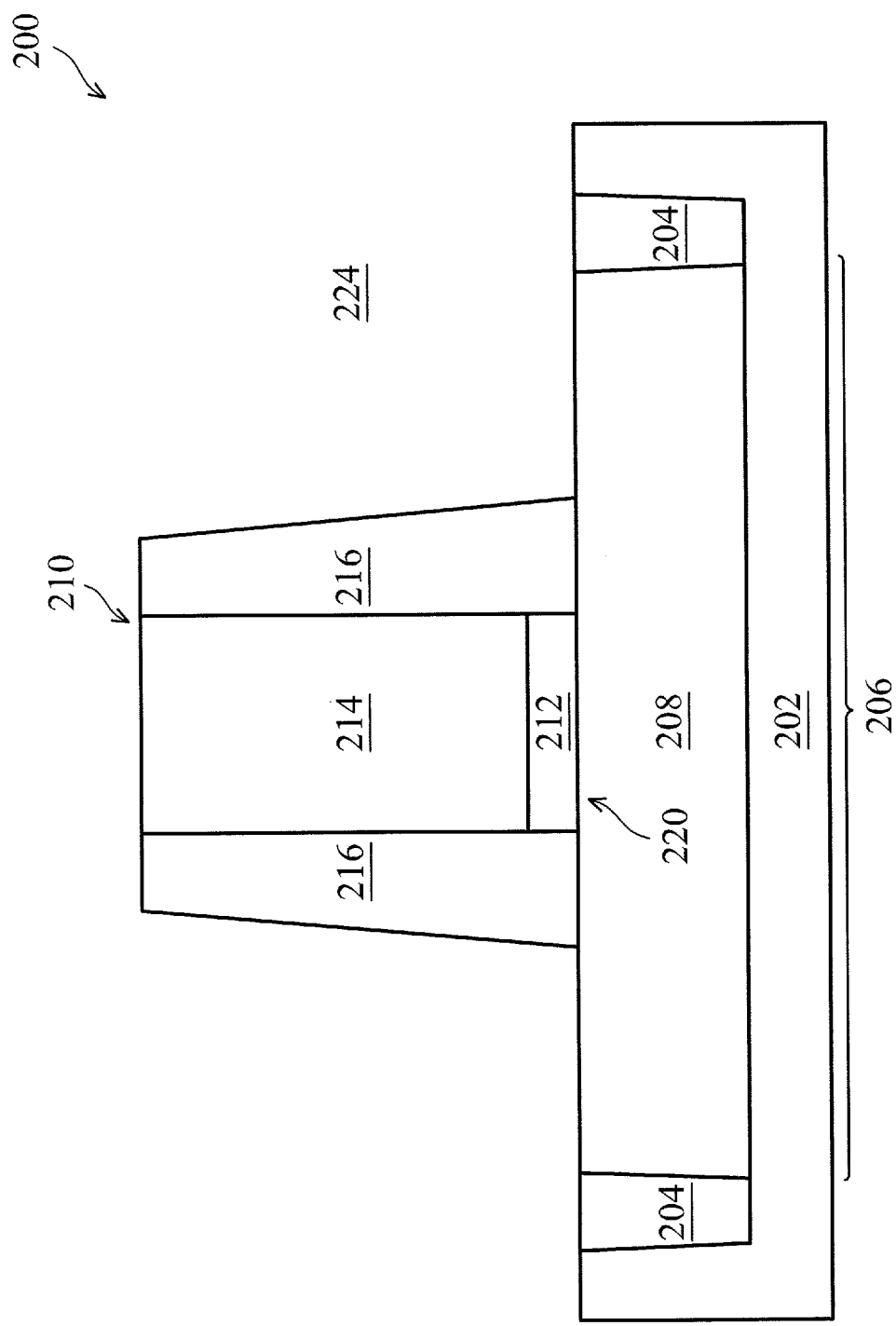

The method continues to operation 106 in which a gate stack 210 (FIG. 2B) is formed on the top surface of the semiconductor substrate 202, in accordance with various embodiments. As shown in FIG. 2B, the gate stack 210 is formed in the active region 206. Further, in some embodiments, the gate stack 210 is overlying and vertically aligned with a channel region 220 defined in the active region 206. The channel region 220 serves as a conductive path when the corresponding FET is turned on during operations.

In some embodiments, the gate stack 210 includes a gate dielectric feature 212 disposed on the semiconductor substrate 202 and a gate electrode 214 disposed on the gate dielectric feature 212. The semiconductor device 200 may further include gate spacers 216 disposed on sidewalls of the gate stack 210.

More specifically, the gate dielectric feature 212 includes a gate dielectric material, such as silicon oxide or a suitable dielectric material having a higher dielectric constant (high-k dielectric material). In accordance with various illustrative embodiments, the gate dielectric feature 212 may include more than one dielectric material layers. For example, the gate dielectric feature 212 may include an interfacial dielectric layer, such as silicon oxide, and a high-k dielectric material layer on the interfacial layer.

The gate electrode 214 includes a conductive material layer, such as doped polysilicon, metal, metal alloy, metal silicide, or a combination thereof. In some embodiments, the gate electrode 214 includes more than one conductive material layers. For example, the gate electrode 214 includes a first conductive layer having a suitable work function on the gate dielectric feature 212 and a second conductive layer disposed on the first conductive layer. In one example, the first conductive layer is a p-type work function metal layer when forming a pFET device. Examples of p-type work function metal layers include tantalum nitride and/or titanium nitride. In another example, the first conductive layer is a n-type work function metal layer when forming a nFET device. Examples of n-type work function metal layers include titanium and/or aluminum. The second conductive layer includes aluminum, tungsten, copper, doped polycrystalline silicon or a combination thereof.

The gate stack 210 is formed by a procedure that includes various deposition processes and patterning. In one embodiment, an interfacial layer is formed on the semiconductor substrate 202. The interfacial layer may include silicon oxide formed by a proper technique, such as an atomic layer deposition (ALD), thermal oxidation or UV-Ozone Oxidation. The interfacial layer may have a thickness less than 10 angstrom (Å). Subsequently, in some embodiments, a high-k dielectric material layer is formed on the interfacial layer. The high-k dielectric layer includes a dielectric material having the dielectric constant higher than that of thermal silicon oxide, about 3.9. The high-k dielectric material layer is formed by a suitable process such as ALD or other suitable technique. Other methods to form the high k dielectric material layer include metal organic chemical vapor deposition (MOCVD), physical vapor deposition (PVD), UV-Ozone Oxidation or molecular beam epitaxy (MBE). In one embodiment, the high-k dielectric material includes HfO$_2$. Alternatively, the high k dielectric material layer includes metal nitrides, metal silicates or other metal oxides. The interfacial layer and the high-k dielectric material layer constitute the gate dielectric layer.

In some embodiments, the gate electrode 214 includes a polycrystalline silicon material. A polycrystalline silicon layer is formed on the gate dielectric layer by a manufacturing technique, such as CVD. In one example, a capping layer may be further formed between the high k dielectric material layer and the polycrystalline silicon layer by a manufacturing technique, such as PVD. The capping layer may include titanium nitride (TiN), tantalum nitride (TaN) or a combination thereof in some examples. The capping layer may serve one or more functions, such as diffusion barrier, etch stop, and/or protection.

After the depositions of the gate dielectric layer and the polycrystalline silicon layer, a gate stack material layer is formed on the substrate 202. The gate stack material layer is patterned to form the gate stack 210. The patterning of the gate stack 210 includes a lithography process and etching. A lithography process forms a patterned resist layer. In one example, the lithography process includes resist coating, soft baking, exposing, post-exposure baking (PEB), developing, and hard baking. The gate stack material layers are thereafter patterned by etching using the patterned resist layer as an etching mask. The etching process may include one or more etching steps. For example, multiple etching steps with different etchants may be applied to etch respective gate stack material layers.

In other embodiments, the patterning of the gate stack material layer may alternatively use a hard mask as an etching mask. The hard mask may include silicon nitride, silicon orynitride, silicon oxide, other suitable material, or a combination thereof. A hard mask layer is deposited on the gate stack material layer. A patterned resist layer is formed on the hard mask layer by a lithography process. Then, the hard mask is etched through the opening of the patterned resist layer, thereby forming a patterned hard mask. The patterned resist layer may be removed thereafter using a suitable process, such as wet stripping or plasma ashing.

Referring still to FIG. 2B, the gate spacers 216 include a dielectric material and may have one or more films. In some embodiments, the gate spacers 216 may include silicon oxide, silicon nitride, silicon oxynitride, other suitable dielectric material, or a combination thereof. The gate spacers 216 are formed by deposition and anisotropic etch (e.g., dry etch).

The method continues to operation 106 in which source and drain (S/D) features 222 (FIG. 2C) are respectively formed in the semiconductor substrate 202, in accordance with various embodiments. In some embodiments, the S/D features 222 are formed by forming respective recesses in the semiconductor substrate 202, and then re-growing the S/D features to fill the respective recesses, which will be described in further detail below. In some embodiments, one or more recesses 221 are formed in the semiconductor substrate 202 within the active region 114 by an operation that includes etching. In some embodiments, the recesses 221 may be formed using, such as a wet (and/or dry) etch process, selectively etch the material of the substrate 202. Further to such embodiments, the gate stack 210, the gate spacers 216, and the STI 204 collectively function as an etching hard mask, thereby forming the recesses 221 in respective source and drain regions. In some examples, an etchant such as carbon tetrafluoride (CF4), tetramethylammonium hydroxide (TMAH), other suitable etchant, or a combination thereof is used to form the recesses 221. In some embodiments, the recesses 221 are formed with a width ranging from about 200 Å to about 800 Å. A cleaning process may follow the etching process using a suitable chemical. The recesses 221 are substantially aligned with the gate stack 210, particularly aligned with outer edges of the gate spacers 216.

As mentioned above, the recesses 221 are then filled with a semiconductor material by a deposition process, thereby epitaxially growing source and drain (S/D) features 222 in crystalline structure. In accordance with various illustrative embodiments, the S/D features 222 may be formed by a suitable process, such as CVD process. In some alternative embodiments, the S/D features 222 may be formed by a selective deposition process. The deposition process to form the S/D features 222 involves chlorine for etching effect and makes the deposition selective. The selective deposition process is designed and tuned to epitaxially grow such that the S/D features 222 formed in the recesses 221 include the semiconductor material in a crystalline structure.

Figure 2C:
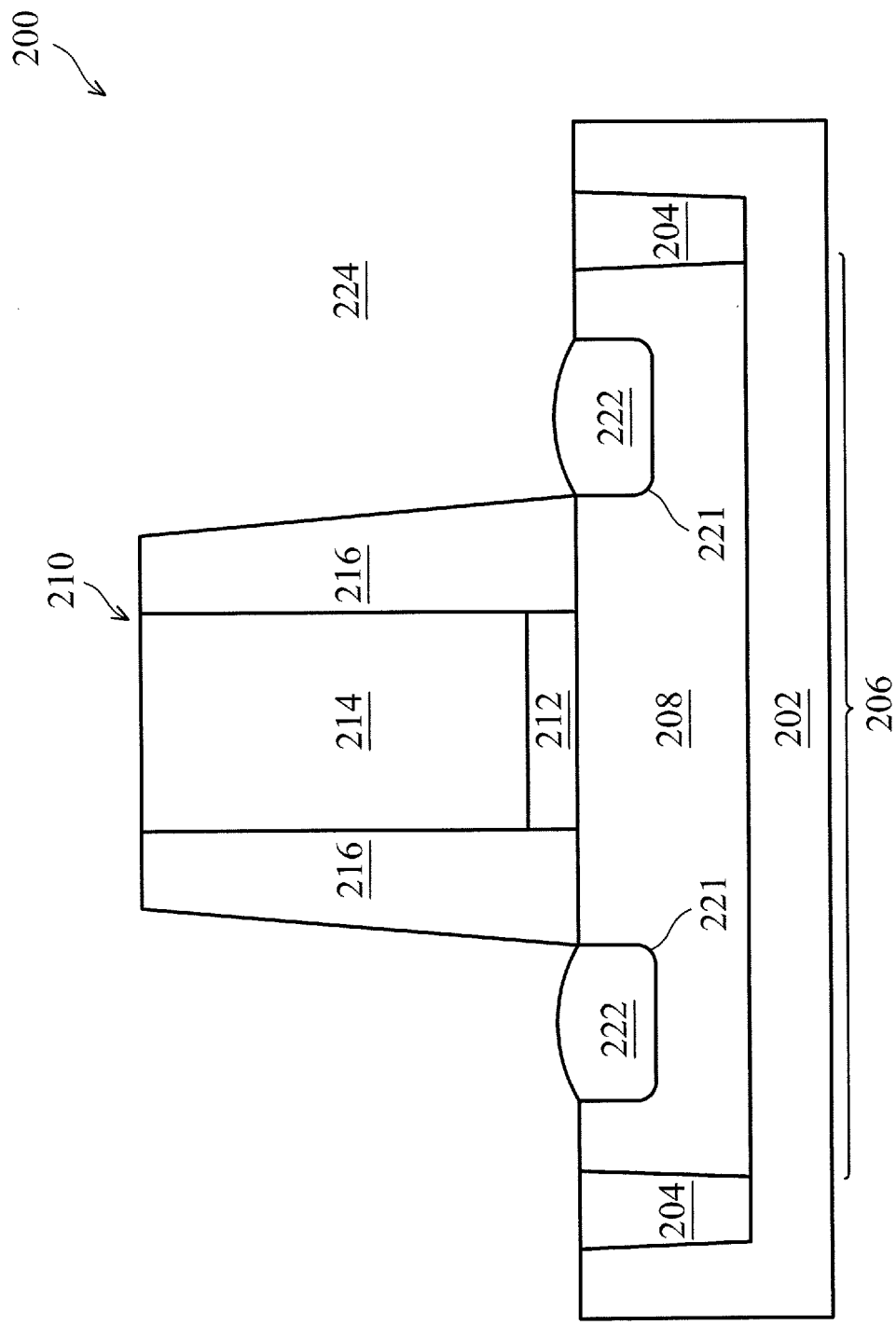
Figure 2D:
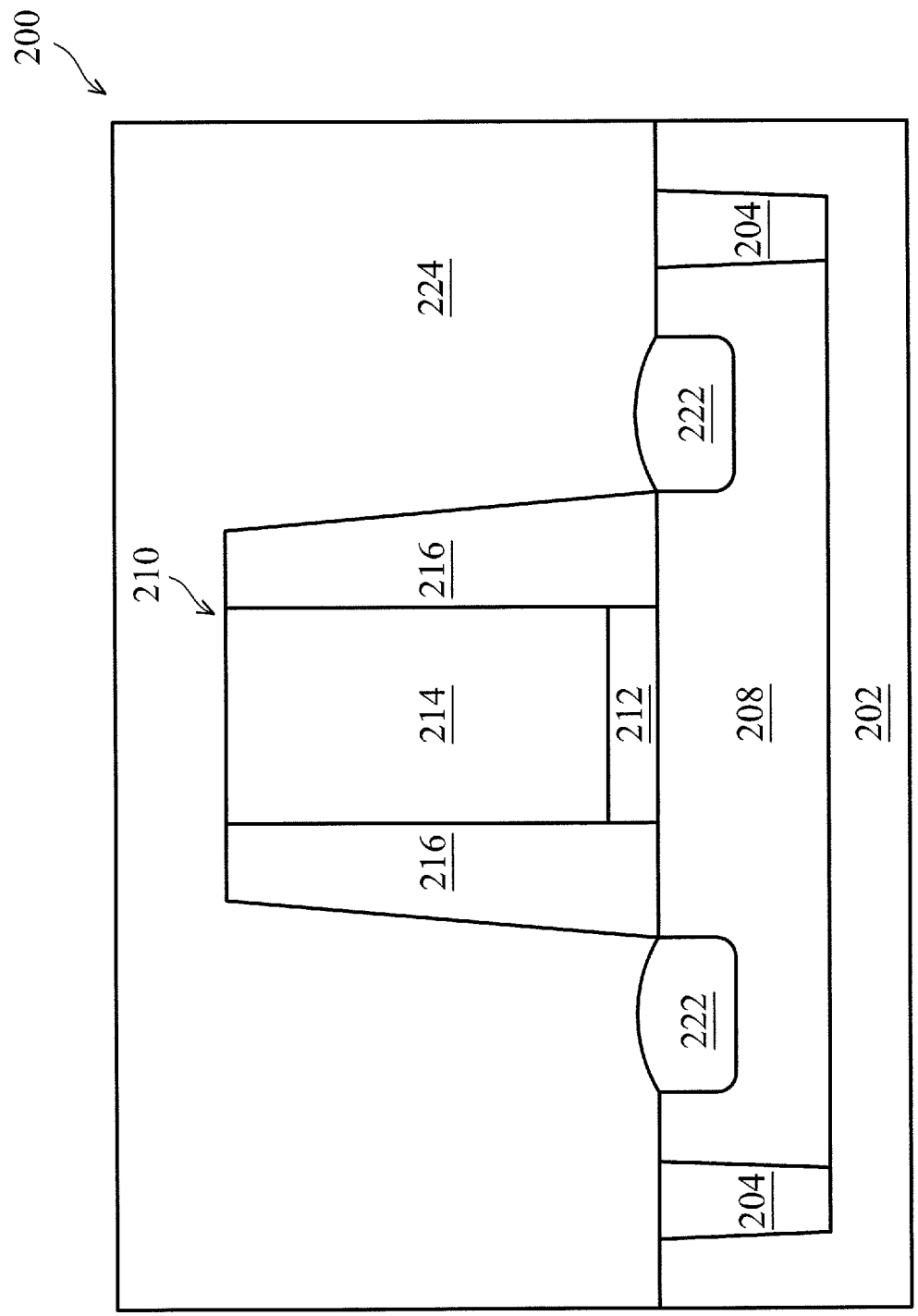
Figure 2E:
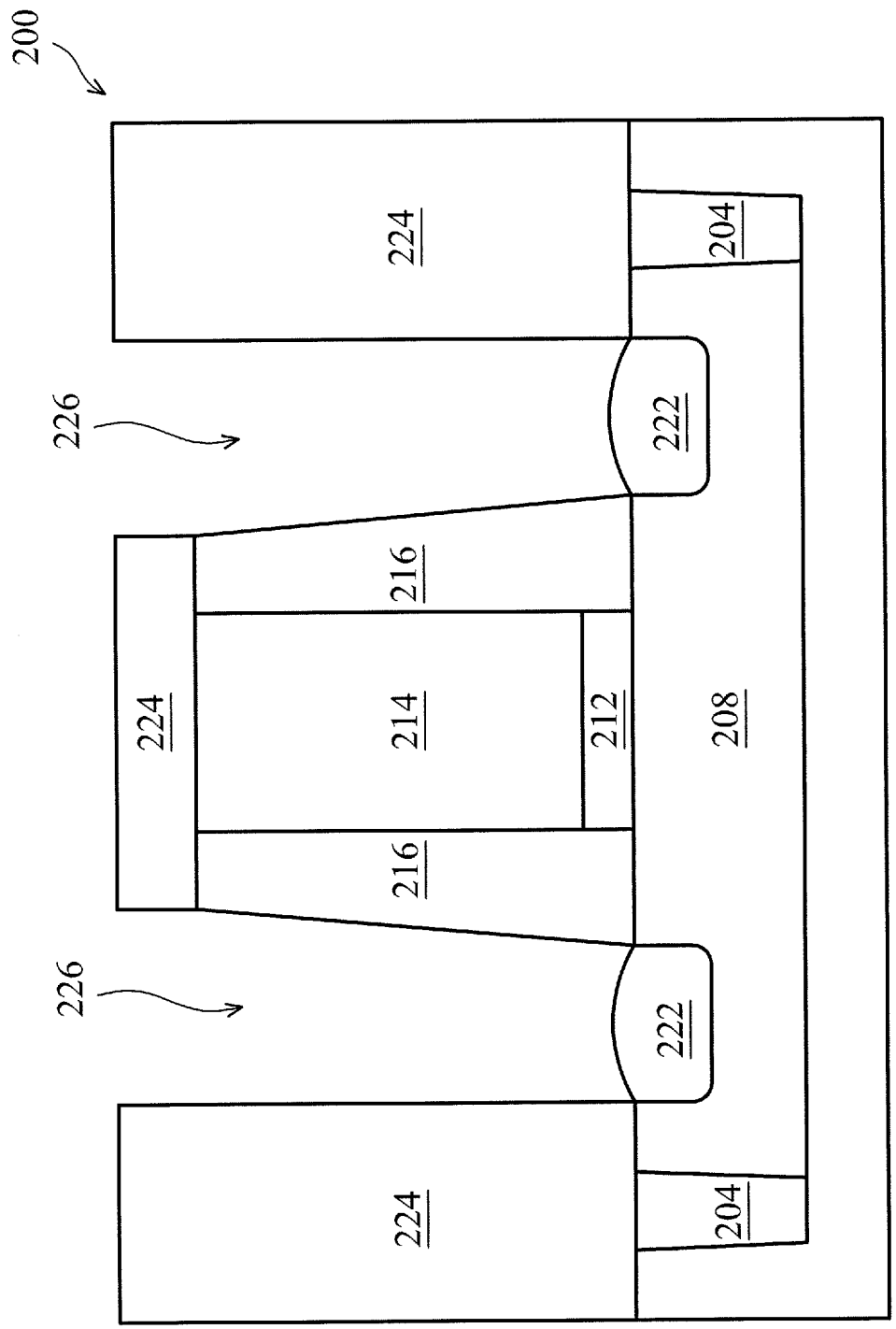

Referring still to FIG. 2C, the semiconductor material of the S/D features 222 may be different from or the same as that of the substrate 202. For example, the semiconductor material includes silicon, silicon carbon, or silicon germanium while the substrate 202 is a silicon substrate. In some embodiments, while the semiconductor material of the S/D features 222 is silicon and the substrate 202 is a silicon substrate, the semiconductor material of the S/D features 222 is generally doped so as to form the S/D features. For example, when the doped well 208 is a p-type doped well, the S/D features 222 may be n-type doped (i.e., doped with phosphorous dopants). Similarly, when the doped well 208 is an n-type doped well, the S/D features 222 may be p-type doped (i.e., doped with boron dopants).

The method continues to operation 108 in which a dielectric layer 224 (FIG. 2D) is formed over the semiconductor substrate 202, in accordance with various embodiments. As shown, the dielectric layer 224 is formed to cover the previously formed features in/on the semiconductor substrate 202, e.g., the STI features 204, the gate stack 210, the S/D features 222, etc. In some embodiments, the dielectric layer 224 is formed to electrically isolate various components formed throughout the semiconductor device 200, and thus the dielectric layer 224 is typically referred to as an Interlayer Dielectric (ILD) layer. The dielectric layer 224 may be formed of one or more low-k (with a dielectric constant "k" between about 1 to 3) materials such as, for example, silicon oxide, a polymer material, or a combination thereof. In some embodiments, the dielectric layer 224 is formed by using a spin-on process, a CVD process, or a combination thereof. Further, the dielectric layer 224 may include a thickness that is about 0.02 μm to 0.1 μm.

The method continues to operation 110 in which one or more contact holes 226 (FIG. 2E) are formed in the dielectric layer 224, in accordance with various embodiments. In general, the contact holes 226 are configured to be formed so as to cause the respective S/D features 222 to be exposed for further process steps. In some embodiments, the contact holes 226 are formed by one or more of the following process steps: a patterned hard mask layer is formed over a top surface of the dielectric layer 224 (FIG. 2D), wherein the patterned hard mask layer includes one or more opening that correspond to locations of respective S/D features 222; by using the patterned hard mask layer as a mask, one or more (dry and/or wet) etching processes are performed to selectively etch the dielectric layer 224 through the openings of the hard mask layer; at least a cleaning process is performed.

Figure 2F:
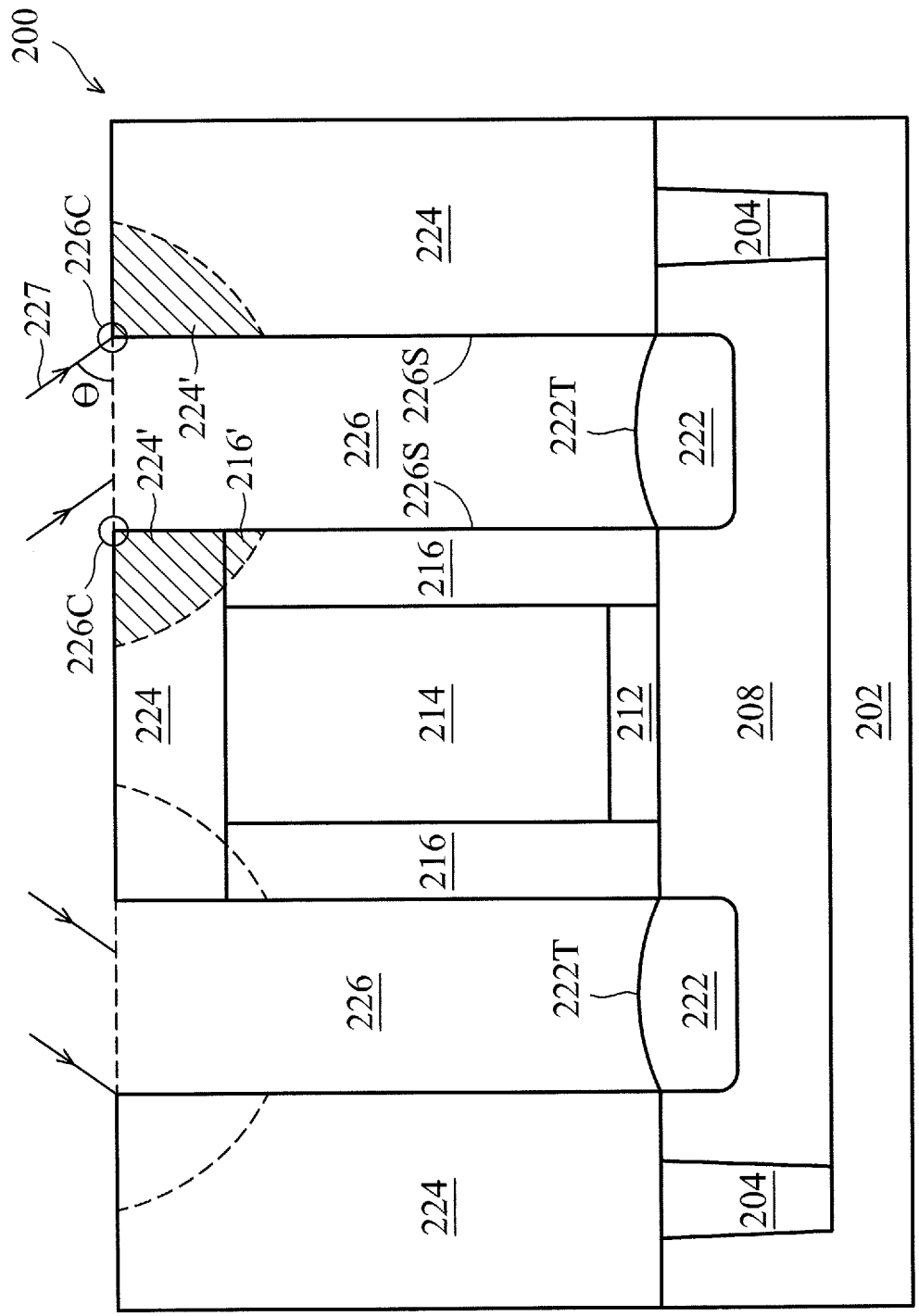
Figure 2G:
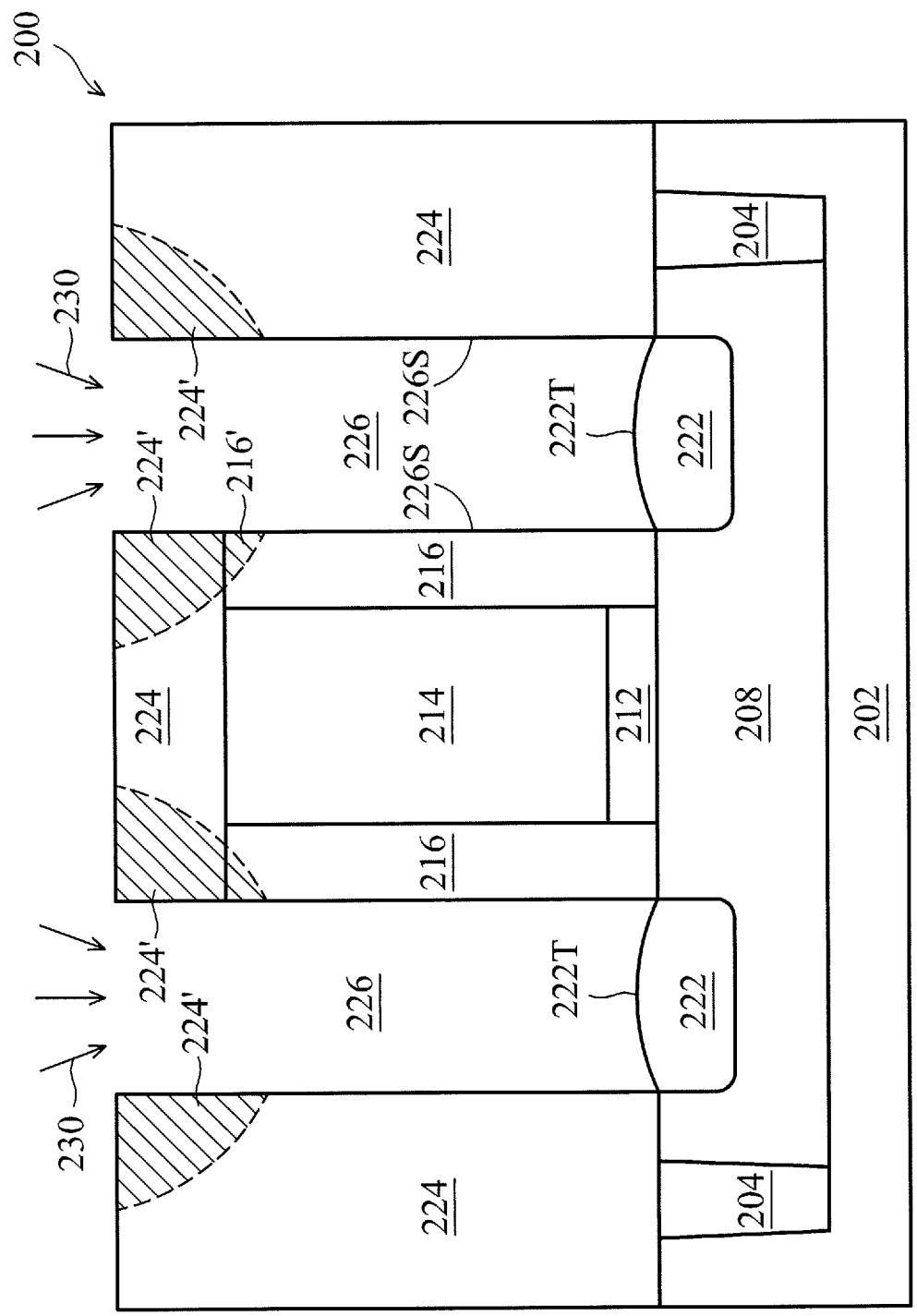
Figure 2H:
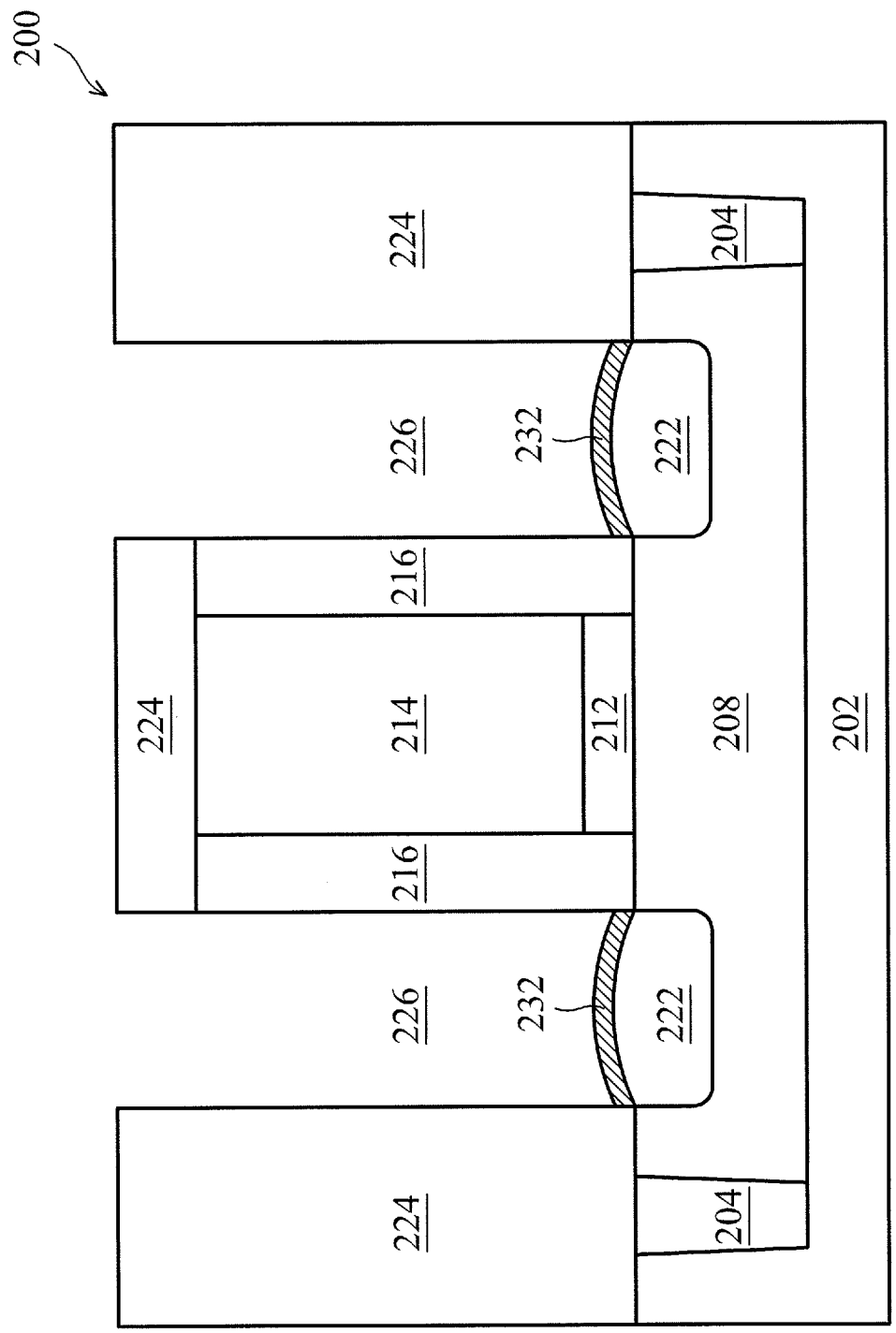
Figure 2I:
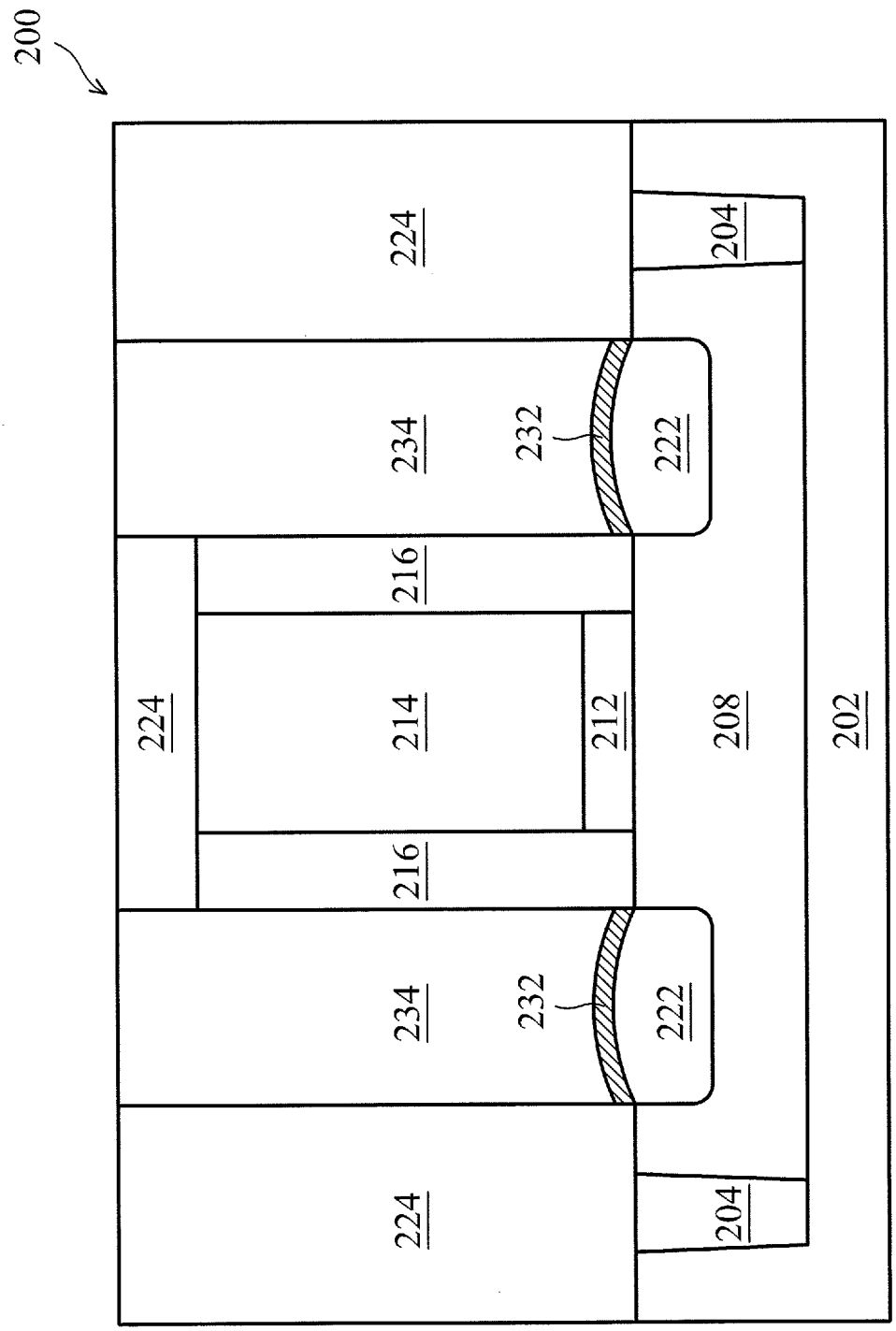

The method continues to operation 112 in which a top corner 226C of sidewall 226S of the respective contact holes 226 is doped by an implantation process 227 (FIG. 2F), in accordance with various embodiments. More specifically, in some embodiments, the implantation process 227 includes using an ion and/or diffusion implantation technique to cause a plurality of dopants (e.g., boron (B), silicon (Si) and/or nitrogen (N)) to penetrate into the top corner 226C of the sidewall 226S by controlling an incident angle ("θ") of the implantation process 227. The incident angle may range between about 0° to about 45°. In some embodiments, the implantation process 227 is an anisotropic process in which the dopants are accelerated by a power source/accelerator (with power about 1 to 10 keV), and anisotropically impinged on a top surface of the top corner 226C with the incident angle θ. As shown in FIG. 2F, such dopants may penetrate through the top surface of the top corner 226C and extends through the top corner 226C with a deepness (e.g., about 20 to 30 nm). That is, an upper corner (224') of the dielectric layer 224 are implanted with the dopants. In some embodiments, the implanted dopants can help the upper corner (224') of the dielectric layer 224 have an increased etch resistivity and thus withstand one or more etching processes. As such, the upper corner 224' may not be etched away or even damaged during later performed etching process(es). Accordingly, once the contact hole 226 is filled with a conductive material to form a contact (which will be discussed in further detail below), a short between the contact and the gate electrode 214, for example, may be advantageously avoided. In some other embodiments, the dopants may penetrate further to the spacer 216 so as to cause an upper corner 216' of the spacer 216 to also have an increased etch resistivity, as illustrated in FIG. 2F.

The method continues to operation 114 in which at least a pre-clean process 230 is performed on the semiconductor device 200 (FIG. 2G), in accordance with various embodiments. In some embodiments, the pre-clean process 230 is performed to remove various oxides (e.g., thermal oxides, native oxides, etc.) that may be possibly formed on the sidewalls 226S and/or a top surface 222T of the S/D features 222. More specifically, such a pre-clean process is an isotropic process. In some embodiments, the pre-clean process 230 includes: placing the semiconductor device 200 in a chamber; activating a power source to dissociate a mixture of etching gas (e.g., ammonia ($NH_3$) and nitrogen trifluoride ($NF_3$)); and flowing the mixture of etching gas together with a purge gas (e.g., argon (Ar)) into the chamber to start the etching process. It is noted that since the upper corner 224' (and/or the upper corner 216') has the increased etch resistivity owing to the anisotropic doping process 227 (FIG. 2F), a morphologic profile of the contact hole 226 may stay substantially intact while the pre-clean process 230 can still remove the undesirable residues/particles in the contact hole 226, in accordance with various embodiments.

The method continues to operation 116 in which a contact layer 232 is formed on the respective S/D feature 222 (FIG. 2H), in accordance with various embodiments. In some embodiments, the contact layer 232 includes a metal silicide layer. Such a metal silicide layer 232 may be formed by one or more of the following processes: forming a metal (e.g., titanium, cobalt, tantalum, nickel, platinum, hafnium, palladium, tungsten, molybdenum, niobium, or a combination thereof) layer on the S/D feature 222; and annealing the semiconductor device 200 so as to start a silification reaction between the S/D feature and the respective metal layer. As such, the metal silicide layer 232 is formed on the respective S/D feature 222. In some embodiments, the metal silicide layer 232 has a thickness that is about 1 to about 8 nm. In some embodiments, a barrier layer (e.g., a metal nitride layer) may be subsequently formed over the metal silicide (contact) layer 232.

The method continues to operation 118 in which the contact hole 226 is filled with a conductive contact material so as to form respective S/D contacts (plugs) 234 (FIG. 2I), in accordance with various embodiments. The conductive contact material may include any of a variety of conductive materials such as, for example, tungsten, copper, aluminum, or a combination thereof. In some embodiments, the formation of the S/D contact 234 may include one or more of the following process steps: depositing the contact hole 226 with at least one of the above-mentioned conductive contact materials (e.g., CVD, ALD, MOCVD, etc.); and performing a planarization process (e.g., a CMP process) to remove excessively deposited conductive contact materials.

In an embodiment, a method of making a semiconductor device is disclosed. The method includes forming a contact hole that is configured to expose a source/drain (S/D) feature of the semiconductor device in a dielectric layer, wherein the contact hole includes a first sidewall that is part of the dielectric layer; doping an upper portion of the first sidewall; and performing an etching process thereby cleaning oxides in the contact hole.

In another embodiment, a method of making a semiconductor device includes forming a gate stack that include a gate electrode and a spacer layer extending along a sidewall of the gate electrode; forming a source/drain (S/D) feature that is adjacent to the gate stack; forming a dielectric layer over the gate stack and the S/D feature; forming a contact hole in the dielectric layer to expose the S/D feature, wherein the contact hole includes a first sidewall that is formed by the spacer layer and part of the dielectric layer; doping an upper portion of the first sidewall; and performing an etching process thereby cleaning oxides in the contact hole.

Yet in another embodiment, a semiconductor device includes a conductive plug on a substrate; a gate stack adjacent to the conductive plug along a first sidewall of the conductive plug; and a dielectric layer adjacent to the conductive plug along a second sidewall of the conductive plug that is opposite from the first sidewall, wherein at least an upper portion of the dielectric layer along the second sidewall comprises a plurality of impinged dopants.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, comprising:
    forming a gate stack that includes a gate electrode and a spacer layer disposed along a sidewall of the gate electrode;
    forming a dielectric layer over and surrounding the gate stack;
    forming a contact hole through the dielectric layer adjacent the sidewall of the gate electrode, wherein the contact hole is configured to expose a source/drain (S/D) feature of the semiconductor device, wherein the contact hole includes a first sidewall that is formed by the spacer layer and a part of the dielectric layer;

doping an upper portion of the first sidewall, wherein the upper portion includes the part of the dielectric layer and a portion of the spacer layer; and performing an etching process thereby cleaning oxides in the contact hole.

2. The method of claim 1, further comprising:

forming a metal silicide layer over the S/D feature after the etching process; and filling the contact hole with a conductive material thereby forming a contact of the semiconductor device.

3. The method of claim 1, wherein the doping the upper portion of the first sidewall includes anisotropically impinging dopants into an upper corner of the first sidewall.

4. The method of claim 3, wherein the dopants include at least one of: boron, silicon, nitrogen, and a combination thereof.

5. The method of claim 1, wherein the gate electrode is covered by part of the dielectric layer.

6. The method of claim 5, wherein the contact hole includes a second sidewall that is formed by a sidewall of the spacer layer.

7. The method of claim 6, further comprising:

doping an upper portion of the second sidewall by anisotropically impinging dopants into the upper portion of the second sidewall.

8. A method of making a semiconductor device, comprising:

forming a gate stack that include a gate electrode and a spacer layer extending along a sidewall of the gate electrode;

forming a source/drain (S/D) feature that is adjacent to the gate stack;

forming a dielectric layer over the gate stack and the S/D feature;

forming a contact hole in the dielectric layer to expose the S/D feature, wherein the contact hole includes a first sidewall that is formed by the spacer layer and part of the dielectric layer;

doping an upper portion of the first sidewall, wherein the upper portion includes the part of the dielectric layer and a portion of the spacer layer; and performing an etching process thereby cleaning oxides in the contact hole.

9. The method of claim 8, further comprising:

forming a metal silicide layer over the S/D feature; and filling the contact hole with a conductive material thereby forming a contact of the semiconductor device.

10. The method of claim 8, wherein the doping the upper portion of the first sidewall includes anisotropically impinging dopants into an upper corner of the first sidewall.

11. The method of claim 10, wherein the dopants include at least one of: boron, silicon, nitrogen, and a combination thereof.

12. The method of claim 10, wherein the dopants penetrate through a sidewall of the spacer layer and an upper corner surface of the part of the dielectric layer.

13. The method of claim 8, wherein the contact hole includes a second sidewall that is formed by another part of the dielectric layer.

14. The method of claim 13, wherein the dopants penetrate through an upper corner surface of the another part of the dielectric layer.

15. A method of making a semiconductor device, comprising:

foisting a gate stack that includes a gate electrode and a spacer layer disposed along a sidewall of the gate electrode;

forming a dielectric layer over and surrounding the gate stack;

forming a contact hole through the dielectric layer adjacent the sidewall of the gate electrode, wherein the contact hole is configured to expose a source/drain (S/D) feature of the semiconductor device, wherein the contact hole includes a first sidewall that is formed by the spacer layer and a part of the dielectric layer;

doping an upper portion of the first sidewall with a dopant, wherein the upper portion includes the part of the dielectric layer and a portion of the spacer layer;

forming a metal silicide layer over the S/D feature after the etching process; and filling the contact hole with a conductive material thereby forming a contact of the semiconductor device.

16. The method of claim 15, further comprising performing an etching process thereby cleaning oxides in the contact hole.

17. The method of claim 15, wherein the dopants include at least one of: boron, silicon, nitrogen, and a combination thereof.

18. The method of claim 15, wherein the gate electrode is covered by part of the dielectric layer and the contact hole includes a second sidewall that is formed by a sidewall of the spacer layer.

* * * * *